(12) United States Patent
Das et al.

(10) Patent No.: US 8,945,304 B2
(45) Date of Patent: Feb. 3, 2015

(54) ULTRAHIGH VACUUM PROCESS FOR THE DEPOSITION OF NANOTUBES AND NANOWIRES

(75) Inventors: Biswajit Das, Henderson, NV (US); Myung B. Lee, Blauvelt, NY (US)

(73) Assignee: The Board of Regents of the Nevada System of Higher Education on behalf of the University of Nevada, Las Vegas University of Nevada, Las Vegas, NV (US)

( * ) Notice: Subject to any disclaimer, the term of this patent is extended or adjusted under 35 U.S.C. 154(b) by 1448 days.

(21) Appl. No.: 12/228,529

(22) Filed: Aug. 13, 2008

(65) Prior Publication Data

US 2009/0047427 A1 Feb. 19, 2009

Related U.S. Application Data

(60) Provisional application No. 60/964,498, filed on Aug. 13, 2007.

(51) Int. Cl.
| | |
|---|---|
| C30B 25/00 | (2006.01) |
| C30B 23/00 | (2006.01) |
| C30B 29/52 | (2006.01) |
| C30B 29/60 | (2006.01) |
| C30B 29/40 | (2006.01) |

(52) U.S. Cl.
CPC .................. *C30B 29/60* (2013.01); *C30B 23/00* (2013.01); *C30B 29/403* (2013.01); *C30B 29/406* (2013.01); *Y10S 117/902* (2013.01)
USPC ................... 117/92; 117/84; 117/88; 117/89; 117/90; 117/91; 117/97; 117/99; 117/102; 117/106; 117/108; 117/902; 117/921

(58) Field of Classification Search
USPC ........... 117/84, 87–94, 97, 99, 102–106, 108, 117/920, 921
See application file for complete search history.

(56) References Cited

U.S. PATENT DOCUMENTS

| | | | |
|---|---|---|---|
| 4,992,305 A * | 2/1991 | Erbil | 427/252 |
| 6,882,051 B2 | 4/2005 | Majumdar et al. | 257/746 |
| 2004/0075464 A1* | 4/2004 | Samuelson et al. | 326/37 |
| 2005/0002849 A1* | 1/2005 | Mitsui et al. | 423/447.1 |
| 2005/0118092 A1* | 6/2005 | Allara et al. | 423/447.1 |
| 2006/0289351 A1 | 12/2006 | Xiao et al. | 210/500.25 |
| 2007/0057415 A1 | 3/2007 | Katagiri et al. | 264/614 |
| 2008/0268288 A1* | 10/2008 | Jin | 428/800 |

FOREIGN PATENT DOCUMENTS

JP 2002069643 A * 3/2002 ............. C23C 16/26

OTHER PUBLICATIONS

Patent Abstracts of Japan. English Abstract and computer translation of JP 2002-069643 (2002).*

* cited by examiner

*Primary Examiner* — Matthew Song
(74) *Attorney, Agent, or Firm* — Mark A. Litman & Associates, P.A.

(57) ABSTRACT

A system and method A method of growing an elongate nanoelement from a growth surface includes:
  a) cleaning a growth surface on a base element;
  b) providing an ultrahigh vacuum reaction environment over the cleaned growth surface;
  c) generating a reactive gas of an atomic material to be used in forming the nanoelement;
  d) projecting a stream of the reactive gas at the growth surface within the reactive environment while maintaining a vacuum of at most $1 \times 10^{-4}$ Pascal;
  e) growing the elongate nanoelement from the growth surface within the environment while maintaining the pressure of step c);
  f) after a desired length of nanoelement is attained within the environment, stopping direction of reactive gas into the environment; and
  g) returning the environment to an ultrahigh vacuum condition.

17 Claims, 2 Drawing Sheets

FIG. 2

| |
|---|
| Clean a growth surface on a base element |
| Provide an ultrahigh vacuum reaction environment over the cleaned growth surface |
| Generate a reactive gas of an atomic material to be used in forming the nanoelement |
| Project a stream of the reactive gas at the growth surface within the reactive environment while maintaining a vacuum of at most $1\times10^{-4}$ Pascal |
| Grow the elongate nanoelement from the growth surface within the environment while maintaining the pressure above |
| After a desired length of nanoelement is attained within the environment, stopping direction of reactive gas into the environment; |
| Returning the environment to an ultrahigh vacuum condition |

ULTRAHIGH VACUUM PROCESS FOR THE DEPOSITION OF NANOTUBES AND NANOWIRES

RELATED APPLICATION DATA

This Application claims priority from U.S. Provisional Patent Application Ser. No. 60/964,498, filed 13 Aug. 2007.

GOVERNMENT RIGHTS

This invention was made with government support under DE-FC52-05NA26999 awarded by the Department of Energy. The government has certain rights in this invention.

BACKGROUND OF THE INVENTION

1. Field of the Invention

The present invention relates to nanotechnology, nanotubes and nanowires and processes for the manufacture of nanosize technology.

2. Background of the Art

Nanotubes and nanowires of various materials have become the subjects of intense, global research efforts in recent years. Fabrication of NTs and NWs made from carbon, nitrides and oxides, metals (e.g., Published US Patent Application 20060289351) and mixtures thereof (e.g., Published US Application 20070057415) have been reported. The interesting combination of electrical and mechanical properties of these NT and NW structures has raised possibilities of revolutionizing fields ranging from computing, optics, field emitter devices, sensors, electrodes, solar cells, high strength composites, hydrogen storage and many other applications.

To date, the most widely used process used to grow NT and NW is a Chemical Vapor Deposition (CVD) process. In CVD process, a substrate, often predeposited with catalytic particles of transitional metals, is heated up to high temperature in presence of high pressure (up to 20 Torr) of feedstocks (such as CO or a hydrocarbon in case of growing carbon based NT and NW). One type of CVD process relies solely on heating of the substrate to promote catalytic breakdown of the feedstock at or around the particles and subsequent formation of NTs or NWs at the particles. This type of CVD process is known as thermal CVD. In another type of CVD process, a strong electric field is applied during the growth process. Introduction of the electrical field generates plasma of the feedstock gas around the substrate. This type of CVD process is called Plasma Enhanced Chemical Vapor Deposition (PECVD). In PECVD, growth of NTs and NWs is facilitated by presence of more reactive gases created from dissociation and ionization of the feedstock gas within the plasma. Moreover, presence of electric field forces NTs and NWs to grow in the direction of the electric field and thus achieving superior alignment of the NTs and NWs.

Although PECVD and thermal CVD have clearly demonstrated to be capable of producing NTs and NWs, there are some fundamental limitations associated with these processes. First, high-pressure requirements of the CVD processes do not allow growth surface of the substrate to be clean to atomic level and kept free of surface contaminants for any appreciable time inside the reactor. This is true for both CVD growth techniques, thus NTs and NWs are grown on top of a surface that is far from atomically clean. High-pressure conditions of the CVD reactors also contribute to increased contamination of exterior of NTs and NWs during and after the growth. Second, the high-pressure requirements effectively eliminate usage of many, if not all, powerful in-situ deposition and analysis tool that requires low-pressure environment to operate. Thus, in-situ processing and monitoring are difficult to carry out in the two CVD processes. In PECVD, the chemical reactions at the substrate surface are difficult to control as the surface is directly exposed to the plasma consisting of many species of radicals, neutrals, ions and electrons of different energies. Nanowires can also be [provided with heterostructure by varying crystalline composition along its length as taught in U.S. Pat. No. 6,882,051.

All references cited herein are incorporated herein in their entirety.

SUMMARY OF THE INVENTION

The present invention enables a versatile Physical Vapor Deposition (PVD) process for the growth of nanowires (NWs) and nanotubes (NTs) constructed from a wide range of materials (metals, metal mixtures, carbons, nitrides, oxides etc.). The process uses molecular flows of reactive gases under an ultra high vacuum (UHV) environment. The PVD process allows for growth of NTs and NWs to be carried out under ultra clean and low pressure environments without exposing the substrate to the presence of high energy particles (ions, radicals, electrons etc.) of a plasma that can damage the substrate and any NTs and NWs growing on top of the substrate. These features allow the PVD process to produce cleaner nanotubes/nanowires with more controllable growth conditions. The PVD process offers the possibilities of developing recipes for growth of sophisticated nanowire structures (vertical P/N junctions, superlattices, etc.) by combining the nanotube/nanowire growth process with a wide range of UHV deposition/functionalization techniques.

The new deposition process described in this invention addresses the above weaknesses of the CVD processes. The new deposition process allows depositions of NTs and NWs to be carried out in an extremely clean environment with the background pressure level that is at least five orders of magnitude less than a typical CVD process during all phases of the growth. Main advantages of this process are: (1) substrate surface can be cleaned to atomic level and preserved in this clean condition for an extended period, (2) substrate surface morphology (or surface reconstruction) can be controlled and monitored prior to and during growth, (3) fluxes of highly reactive gases with thermal energy (and thus low impact damages to the surface) can be precisely and rapidly controlled, (4) surface reactions at the substrate can be better analyzed and optimized since the surface is not affected by the processes involved in generating the reactive gases, (5) potential for low temperature growth (below 500° C.) by utilizing high reactivity of the gases, (6) ability to instantaneously modify strength and direction of electrical field above the growth surface, (7) ability to carry out in-situ doping, post growth (of NTs) deposition or other functionalizations, and, (8) the ability to use the entire arsenal of the latest surface treatment and analysis tools that can only operate under UHV conditions.

BRIEF DESCRIPTION OF THE FIGURES

FIG. 2 shows a flow diagram for performing a non-limiting example of a nanoelement manufacturing process in a pressure chamber useful in the practice of the present technology.

DETAILED DESCRIPTION OF THE INVENTION

Figure 1:
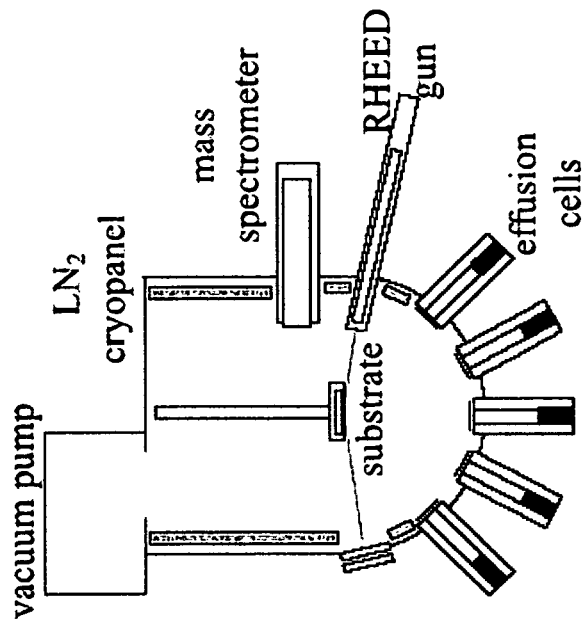
FIG. 1 shows a schematic of a chamber for use in the practice of the present technology.

The absence of mass within a volume and the reduction of vapor or gaseous presence within a volume is the basis for pressure measurements. The degree of absence of mass is the basis for distinguishing degrees of vacuum, which have been essentially standardized within the various technical fields as:

| Pressure range (See note below) | | |
|---|---|---|
| Pascal (absolute mode) | Pascal (absolute mode) | 'Degree of vacuum' |
| $1 \times 10^5$ to $3 \times 10^3$ | 100 000 to 3 000 | low vacuum |
| $3 \times 10^3$ to $1 \times 10^{-1}$ | 3 000 to 0.1 | medium vacuum |
| $1 \times 10^{-1}$ to $1 \times 10^{-4}$ | 0.1 to 0.000 1 | high vacuum |
| $1 \times 10^{-4}$ to $1 \times 10^{-7}$ | 0.000 1 to 0.000 000 1 | very high vacuum |
| $1 \times 10^{-7}$ to $1 \times 10^{-10}$ | 0.000 000 1 to 0.000 000 000 1 | ultra-high vacuum (UHV) |
| $<1 \times 10^{-10}$ | <0.000 000 000 1 | extreme-ultrahigh vacuum (EHV or X |

Note: The two lists of pressure ranges shown in the table above are numerically identical, the left column style being known as scientific notation. Atmospheric pressure is nominally $1 \times 10^5$ Pa (100 000 Pa) so, for example, high vacuum covers a range that is somewhere between one millionth and one thousand millionth the value of nominal atmospheric pressure.

For purposes of the practice of the present invention, UHV shall be any pressure of $\leq 1 \times 10^{-7}$ P, up to any commercially enabled level of pressure. The length of the nanofilaments, nanotubes and the like that can be grown has not been found to be limited except by the size of the chamber. Lengths of millimeters, centimeters and up to 100 cm or more are theoretically possible based on early experimentation. Diameter changes are controllable to a lesser degree based on the size (diameter) of a starting catalyst spot on the cleaned surface and/or other factors that determine an initial diameter size from which the filaments and tubes are grown.

The present technology comprises method and apparatus and resulting nanoelement products. The method may be described as a method of growing an elongate nanoelement (e.g., nanowire, nanotube, nanofilament) from a growth surface. Growth surfaces may be any composition known in the art as useful for supporting growth of nanowires (NWs) or nanotubes (NTs) under prior art procedures, usually a dielectric material of high purity, such as a silica surface. The process may be generally described as:

a) cleaning a growth surface (cleaning being done according to at least conventional standards applied to surfaces in chip, circuit and/or board making processes currently used);

b) providing an ultrahigh vacuum reaction environment over the cleaned growth surface;

c) generating a reactive gas of an atomic material (e.g., especially atomic materials such as carbon, metals, metalloids, and other materials used for forming nanotubes of nanofilaments under Chemical Vapor Deposition) to be used in forming the nanoelement;

d) projecting a stream of the reactive gas at the growth surface within the reactive environment while maintaining a vacuum of at most $1 \times 10^{-4}$ Pascal, wherein at least 90% of any elevation in pressure results from introduction of the reactive gas into the environment;

e) growing an elongate nanoelement from the growth surface within the environment while maintaining the pressure of step c);

f) after a desired length of nanoelement is attained within the environment, stopping direction of reactive gas into the environment; and g) returning the environment to an ultrahigh vacuum condition.

Seeding of the initiation of the growth, which can strongly influence the diameter of the growing nanoelement can be done by physically seeding the surface with a nanoparticle, providing a nanocatalyst spot (as is done in growing nanotubes) before step d), or can be accomplished by the initial projection of materials in step d) above.

The new PVD process may be carried out in commercial chambers or modified chambers that can support the ultrahigh vacuum and are fitted with the reactive gas projector. For example, the process can be carried out in a stainless steel vacuum chamber.

The vacuum chamber may contain strategically located flanges with UHV seals for mounting of a substrate holder, in-situ monitoring processing tools (such as mass spectrometer and RHEED gun, as shown in FIG. 1) and UHV compatible sources (such as effusion cells as shown in FIG. 1) for generating reactive gaseous species. All source flanges are oriented so that sources mounted on these flanges may be or are directed toward the substrate. The inner wall of the chamber is lined with a cooling panel such as a liquid nitrogen ($LN_2$) cooled cryopanel. The chamber is pumped to a base ultrahigh vacuum pressure of, for example, $2 \times 10^{-10}$ Torr or less prior to introduction of reactive gases into the chamber. When the cryopanel is cooled with $LN_2$, the base pressure can reach down to $10^{-11}$ Torr.

The substrate manipulator should be capable of continuous azimuthal rotation around its axis to improve uniformity across the wafer. The heater behind the sample is designed to allow heating of the wafer to very high temperature (up to 1,000° C.) without impurity outgassing while achieving excellent temperature uniformity across the wafer (+/−1% @ 700° C. under UHV). The special heater element used should be chemically inert and is compatible to be used in presence of reactive gases including oxygen, these heater elements being commercially available for other CVD processes.

Reactive gases needed for growth of NTs and NWs are generated inside the chamber by two different types of the sources. These sources may be:

1. Effusion cells in which highly pure solid charges are thermally heated to generate beams of molecular gases directed toward the sample. Effusions cells can be operated up to 2,000° C. and are suitable for evaporating materials such as Aluminum, Galium, Indium and Zinc. Beams of these gases are needed during growth of nitride NTs/NWs and oxide NTs/NWs.
2. Radio Frequency (RF) plasma sources for generating reactive oxygen species (for growing oxide NTs/NWs, that is nanotubes or nanowires), nitrogen species (for growing nitride NTs/NWs) and hydrocarbon species (for growing carbon NTs/NWs). The type of RF plasma source utilized consists of a small cavity surrounded by the radio frequency (RF) coil. The end plate of the cavity contains an aperture plate with a collection of tiny apertures through which the activated gas escapes the source and enters the chamber.

Some UHV compatible in-situ monitoring tools that can be used to facilitate optimization of NTs/NWs growth procedures include Reflectance High Energy Electron Diffraction (RHEED) for monitoring crystal structure of the growth surface prior to growth, Auger Electron Spectroscopy (AES) for elemental characterization of surface adsorbates before and after the growth, Quadruple Mass Spectrometry (QMS) for analysis of residual gases inside the chamber before, during and after the growth.

A Kauffmann type broad beam ion source can be used for sputter cleaning of the wafer. A set of electrodes may be placed near the substrate for introducing electric field around the substrate with the ability to change orientation of the electric field during growth.

Further Description of Process
Step 1: Growth Surface Cleaning and Preparation

Since the new PVD process is carried out under UHV conditions, growth surfaces of a wide range of substrates can be prepared, prior to the growth, to be completely free of surface contaminants with the outermost surface atoms arranged in a specific orientation that is most favorable for high quality NTs/NWs growth. Under UHV, surface contaminants can be removed in three possible ways. First, the wafer can be heated up to very high temperature for thermal desorption of adsorbates. Si surface, for example, can be made free of native oxides by heating the wafer to 1,000° C. Second surface cleaning process is ion sputter cleaning. In a typical ion sputter cleaning step, an inert gas ion ($Ar^+$ in most cases) of about 500 eV in energy is used to bombard the substrate. Incident ion beam physically removes surface contaminants present in the growth surface. Third surface cleaning process is reactive surface cleaning. Reactive surface cleaning utilizes thermal energy hydrogen atoms or oxygen atoms to reactively clean the growth surface at low temperature. Reactive surface cleaning process is the preferred cleaning method for those substrates that cannot tolerate high temperature processing and/or be damaged by bombardment of ions with 500 eV incident energy. All of the above substrate cleaning methods, as well as other methods, can be utilized to clean the growth surface for the proposed UHV PVD growth process.

Once the growth surface has been cleaned, prevailing UHV condition of the vacuum chamber allows the growth surface to be maintained at this atomically cleaned condition for an extend period of time. (At chamber base pressure of $1\times10^{-10}$ Torr, the expected time required to form 1 monolayer (ML) of surface adsorbate is about 10,000 seconds.) During this time period in which the growth surface remains clean, one can thermally anneal the substrate to (1) remove any surface damages caused by sputtering and make the growth surface atomically smooth, or (2) thermally rearrange outer most atoms of the growth surface to form a specific surface reconstruction that is most favorable for growth of NTs/NWs.

Prior to growth, confirmation of atomically clean growth surface can be made by performing AES or another appropriate technique. Identification of the specific surface reconstruction pattern can be observed with RHEED or another technique.

As the initial nucleation steps of NTs/NWs growth are strongly influenced by surface properties of the substrate, the new PVD process with the ability to prepare the growth surface with atomic level precision, offer much advantages over conventional thermal CVD and PECVD.

Step 2: Generation of Reactive Gases

Reactive gases needed for growth of NTs/NWs are generated by either thermally heating of effusion cells containing solid charges or running gases through discharge zones of RF plasma sources. Pure $O_2$ and $N_2$ gases may be used to generate reactive species of oxygen and nitrogen. A mixture of hydrocarbon and Argon gases are used to generate reactive species of carbon containing molecules.

Fluxes of reactive gases generated by effusion cells are controlled by adjusting temperatures of the effusion cells. Fluxes of reactive gases generated by RF plasma sources are adjusted by controlling flow rates of the gases to the sources. Composition (i.e., ratio of the metastable excited molecular species and atomic species) of oxygen and nitrogen beam can be adjusted by changing the RF power and gas flow used during the discharge.

Once the sources for the reactive gases are in full operational mode and start producing beams of gases inside the chamber, the chamber pressure rises to about $10^{-5}$ Torr. At this working pressure level, mean free path length of the reactive gases are still longer than the distance between orifices of the sources and the substrate. The significance of this is that each gaseous particle leaving the source reaches the substrate without encountering collisions with background gases. Thus the gas particles generated by each source form a beam that travels to the growth surface under molecular flow condition. Under this condition, each gas particle leaving a source maintains its energy state and travel direction during its journey toward the growth surface.

The schemes for generating and transporting the reactive gases utilized by the new PVD process allow for superior control of chemical reactions at the growth surface. In the PVD process, plasma discharges needed to generate reactive gases occur far away from the growth surface. Thus, chemical reactions at the growth surface that produces NTs and NWs are not affected by the high energy reactions occurring in the plasma. In contrast, in a PECVD process, the growth surface is surrounded by the plasma and chemical reactions at the surface are likely to be influenced by most, if not all, of the reactions occurring at the plasma. Additionally, in the new PVD process, properties (incident energy and momentum, electronic and chemical state, etc.) of each reactive gas particle leaving the source remain unchanged during its travel toward the growth surface. Thus, one can, to large extent, select properties of the reactive gases hitting the surface by controlling the operating parameters of the sources. This kind of control of incident gas particles is not possible in the CVD and the PECVD processes developed to date for growing NTs and NWs.

Step 3: Growth of NTs and NWs

Once the substrate has been properly prepared and the sources are tuned to produce molecular beams of reactive gases, growth of NTs/NWs is started by simply opening the shutters in front of the sources and thus exposing the growth surface to incoming molecular beams of reactive gases. The growth can be terminated by simply interrupting the flows of the incident beams by closing the source shutters.

For the growth of carbon based NTs/NWs, a molecular beam of cracked hydrocarbon molecules from a RF plasma source is needed. For nitride NTs/NWs, co-deposition of a group III beam (Ga, In, Al) from an effusion cell and/or activated nitrogen beam from a RF plasma source is needed. And for oxide NTs/NWs, co-deposition of activated oxygen beam from RF plasma source with a beam of element such as Zn, Ti and other material are needed.

The presence of electrodes around the substrate can be used to create electric field near the growth surface. As the effusion cells evaporate only neutral molecular species, and the RF plasma source can be tuned to emit only neutral species of reactive gases, incident beams needed for growth of NTs/NWs are not affected by presence of the electric field. However, if the chemical reactions at or near the surface involves ionic species, introduction of electrical field could provide the necessary guiding force to direct growth of NTs/NWs in the direction along the electrical field. Taking this possibility one step further, one may be able to abruptly change growth direction of the NTs/NWs by changing orientation of the electrical field while NTs/NWs are growing. Using this idea, it may be possible to develop a recipe for growing NTs/NWs with specific shapes or contours.

Because the chamber allows co-deposition of many materials and flux of each source can be introduced or interrupted rapidly (typically less than 0.1 second), the new PVD system is capable of growing more complex nanoscale structures such as superlatticed NTs/NWs and doped NTs/NWs. For example, growth of GaN/InN superlattice NTs/NWs maybe achieved by continuously exposing the growth surface to nitrogen beam while alternatingly exposing the surface to Ga and In beams. In-situ doping of NTs/NWs may be achieved by exposing the growth surface to a beam of dopant gas (generated from an effusion cell) while NTs/NWs are growing.

Step 4: Post Growth Treatments

Once NTs/NWs are successfully grown, these nanostructures can be further processed inside the vacuum chamber prior to removing the nanostructures from the UHV environment. Some of the post growth treatments include:

Reactive surface cleaning: It has been reported that carbon nanotube (CNT) are often covered with amorphous carbon deposits on outer walls of the tube. This undesirable coating of amorphous carbon may be reactively etched away by exposing CNTs to a beam of atomic hydrogen generated by the RF plasma source. Atomic hydrogen beam with thermal energy can be produced by running the plasma source with $H_2$ gas. Since it is likely that atomic hydrogen will preferentially attack amorphous carbon, in-situ hydrogen cleaning is expected to do little damage to CNT lattice during the limited time needed to etch away amorphous carbon.

Low energy ion beam in range of 40 eV has been demonstrated to be effective in implanting Fullerenes. At this energy, the incident ions have enough energy to penetrate the carbon lattice of Fullerenes without damaging it. Given the structural similarity of Fullerenes with CNTs, it is expected that an ion beam of the similar energy range can be an effective tool as post growth implanting of CNTs. In the PVD chamber, this post growth ion implanting can be carried out by simply irradiating CNTs to a beam of low energy ions generated by an appropriate ion source mounted to the chamber.

Additional Process Benefits

1. The process described herein can be viewed as relying upon molecular flow of cracked hydrocarbon species directed at the substrate. This means that incident energy and electronic state of a cracked hydrocarbon species (as generated by the RF plasma source) will remain unchanged from the time they leave the source until they hit the surface. This is because the cracked hydrocarbons species do not collide with each other or with back ground gases as until it hits the surface, so that it is the species themselves that directly impact the surface and may attach or react thereto. There is no intermediate reaction with the majority (at least 50%, at least 70%, at least 85%, at least 95%) of the cracked hydrocarbon species before contact with the surface or other species attached or reacted to the surface. Thus, our process allows the possibility of growing carbon nanotubes (CNT) using a beam of cracked hydrocarbon species that have certain specific distribution of the electronic state and molecular species. For example, by using different conductance apertures or different level or RF power to the source, we may make the beam more rich in uncracked but metastably excited natural hydrocarbon species or use another aperture plate or different gas flow of higher RF power to make the beam more rich in cracked hydrocarbon species. This ability to prepare specific types of beam composition can only be done with the process and not with a UHV CVD process. Thus the process includes the ability to change, alter, and controllably vary and build layer content and region content of species on the surface. A plan can be implemented where a specific distribution of different species and concentration and volume and area of species is designed, and that plan implemented by process control (usually by designed programming) to produce continuous distributions of species, discontinuous (e.g., patterned) distributions of specific or single species, patterns and distributions of at least two different species or variations (partially reacted, different states, different crystallinity) of a single species or multiple species, graded thicknesses of multiple species (e.g., beginning with 100% of one species at the surface and gradually transitioning to a different concentration of that one species to the surface which may be from 0.5% to 100% of a second species or multiple species), and continuous layers with two-dimensional (along the plane or parallel to the plane of the surface) variation in composition.

2. Because the presently described process relies on molecular flow of the reactive species, we can control the incident direction of the beam. This allows for in-situ masking and possibly even a combinatorial deposition of CNT. In contrast, any kind of UHV chemical vapor deposition (CVD) process can not attempt these tasks as gas flow around the substrate is more or less uniform. It is also possible to provide angular gradation of shape, thickness and content in the process by angular direction of the species.

3. Finally, In CVD process, the growth surface is not protected from any kind of plasma process employed to promote the growth. This is because the growth surface sits in middle of the plasma envelope. This means that the growth surface morphology and catalytic particles on the surface are bombarded by high energy ions and other charged particles present in the plasma. Thus, the exact condition of the growth surface can not be maintained or controlled during growth. In contrast, the presently described process allows the total separation of the growth surface from the plasma needed to generate activated or cracked hydrocarbon species. This is because cracking or activation of the hydrocarbon species is done inside the discharge tube of the RF plasma source that is located in significant distance away from the growth surface.

What is claimed:

1. A method of growing an elongate nanoelement from a growth surface comprising:
   a) cleaning a growth surface on a base element;
   b) providing an ultrahigh vacuum reaction environment of less than $10^{-7}$ Torr over the cleaned growth surface;
   c) generating a reactive gas of an atomic material to be used in forming the nanoelement;
   d) projecting a stream of the reactive gas at the growth surface within the reactive environment while maintaining a vacuum of at most $1 \times 10^{-4}$ Pascal, wherein the reactive gas comprises a cracked hydrocarbon species;

e) growing the elongate nanoelement from the growth surface within the environment while maintaining the pressure of step c);

f) after a desired length of nanoelement is attained within the environment, stopping direction of reactive gas into the environment; and g) returning the environment to an ultrahigh vacuum condition of less than $10^{-7}$ Torr.

2. The method of claim 1 wherein in step d), at least 90% of any elevation in pressure between steps b) and d) results from introduction of the reactive gas into the environment.

3. The method of claim 1 wherein the surface cleaning is performed by a process selected from the group consisting of thermal desorption of adsorbates, ion sputter cleaning and reactive surface cleaning.

4. The process of claim 1 wherein at least 50% by number of all molecules of the cracked hydrocarbon species that contacts the growth surface or material deposited on the growth surface consist of the same cracked hydrocarbon species projected as a stream in step d).

5. The method of claim 1 wherein the cracked hydrocarbon species comprise molecules provided from a RF plasma source.

6. The method of claim 1 wherein a nitride NTs/NWs nanoelement is deposited, and there is co-deposition of a group III element from a beam is provided from an effusion cell and activated nitrogen beam from a RF plasma source is provided.

7. The method of claim 6 wherein the group III element is selected from the group consisting of Ga, In and Al.

8. The method of claim 1 wherein an oxide NTs/NWs is deposited, and there is co-deposition of activated oxygen beam from RF plasma source.

9. The method of claim 8 wherein there is also codeposition from a beam of an additional element.

10. The method of claim 9 wherein the additional element is selected from the group selected from Zn and Ti.

11. The method of claim 1 wherein projecting of the stream in step d) is performed while varying RF power to a source of the reactive material.

12. The method of claim 11 wherein the reactive material consists of a hydrocarbon species and RF power is varied upward during the method to make the stream more rich in an uncracked but metastably excited natural hydrocarbon species.

13. The method of claim 11 wherein the reactive material consists of a carbon source and RF power is varied upward during the method to make the stream more rich in carbon species.

14. A method of growing an elongate nanoelement from a growth surface comprising:

a) cleaning a growth surface on a base element; b) providing an ultrahigh vacuum reaction environment over the cleaned growth surface; c) generating a reactive gas of an atomic material to be used in forming the nanoelement;

d) projecting a stream of the reactive gas at the growth surface within the reactive environment while maintaining a vacuum of at most $1\times10^{-4}$ Pascal, wherein the reactive gas comprises a cracked hydrocarbon species;

e) at least 95% of the reactive gas generated impacting the growth surface without undergoing a chemical reaction;

f) growing the elongate nanoelement from the growth surface within the environment while maintaining the pressure of step d);

g) after a desired length of nanoelement is attained within the environment, stopping direction of reactive gas into the environment; and h) returning the environment to an ultrahigh vacuum condition of less than $10^{-7}$ Torr.

15. The method of claim 14 wherein in step d), at least 90% of any elevation in pressure between steps b) and d) results from introduction of the reactive gas into the environment.

16. The method of claim 14 wherein the surface cleaning is performed by a process selected from the group consisting of thermal desorption of adsorbates, ion sputter cleaning and reactive surface cleaning.

17. A method of growing an elongate nanoelement from a growth surface comprising: a) cleaning a growth surface on a base element;

b) providing an ultrahigh vacuum reaction environment of less than $10^{-7}$ Torr over the cleaned growth surface;

c) generating a reactive gas of an atomic material to be used in forming the nanoelement;

d) projecting a stream of the reactive gas at the growth surface within the reactive environment while maintaining a vacuum of $10^{-5}$ Torr, wherein the reactive gas comprises a cracked hydrocarbon species;

e) growing the elongate nanoelement from the growth surface within the environment while maintaining the pressure of step c);

f) after a length of nanoelement is attained within the environment, stopping direction of reactive gas into the environment; and g) returning the environment to an ultrahigh vacuum condition of less than $10^{-7}$ Torr.

* * * * *